United States Patent
Kuit

(10) Patent No.: US 7,151,590 B2
(45) Date of Patent: Dec. 19, 2006

(54) TRANSPORT SYSTEM FOR A LITHOGRAPHIC APPARATUS AND DEVICE MANUFACTURING METHOD

(75) Inventor: Jan Jaap Kuit, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 84 days.

(21) Appl. No.: 10/784,893

(22) Filed: Feb. 24, 2004

(65) Prior Publication Data
US 2005/0185160 A1  Aug. 25, 2005

(51) Int. Cl.
G03B 27/42 (2006.01)
G03B 27/72 (2006.01)

(52) U.S. Cl. .................. 355/53; 355/72; 414/935

(58) Field of Classification Search ............. 355/53, 355/72; 396/611; 414/935, 937, 939, 940, 414/941
See application file for complete search history.

(56) References Cited

U.S. PATENT DOCUMENTS

| | | | | |
|---|---|---|---|---|
| 5,024,570 A | * | 6/1991 | Kiriseko et al. | 414/222.06 |
| 5,399,531 A | * | 3/1995 | Wu | 700/112 |
| 5,844,662 A | * | 12/1998 | Akimoto et al. | 355/27 |
| 5,963,753 A | * | 10/1999 | Ohtani et al. | 396/611 |
| 6,099,598 A | * | 8/2000 | Yokoyama et al. | 29/25.01 |
| 6,235,634 B1 | * | 5/2001 | White et al. | 438/680 |
| 6,239,859 B1 | * | 5/2001 | Park | 355/27 |
| 6,604,624 B1 | * | 8/2003 | Hirata et al. | 198/494 |
| 6,716,648 B1 | * | 4/2004 | Iriki | 438/14 |
| 6,737,207 B1 | * | 5/2004 | Imai | 430/30 |
| 6,832,863 B1 | * | 12/2004 | Sugimoto et al. | 396/611 |
| 2005/0057733 A1 | * | 3/2005 | Owen et al. | 355/30 |

OTHER PUBLICATIONS

U.S. Appl. No. 10/964,815, filed Oct. 15, 2004, Kruijswijk et al.
U.S. Appl. No. 10/731,430, filed Dec. 10, 2003, Paxton et al.

* cited by examiner

Primary Examiner—Alan Mathews
(74) Attorney, Agent, or Firm—Pillsbury Winthrop Shaw Pittman LLP

(57) ABSTRACT

A lithographic apparatus and a device manufacturing method is disclosed. In particular, a transport system configured to transport substrates between the lithographic apparatus and a track is disclosed, the track comprising one or more processing devices. The transport system may also transport substrates between the processing devices within the track. In an embodiment, the transport system comprises a transporter pathway along which one or more tracks and lithographic apparatuses are spaced. The substrates can be transported along the transporter pathway by a transporting device adapted to hold a substrate.

23 Claims, 3 Drawing Sheets

Fig. 2
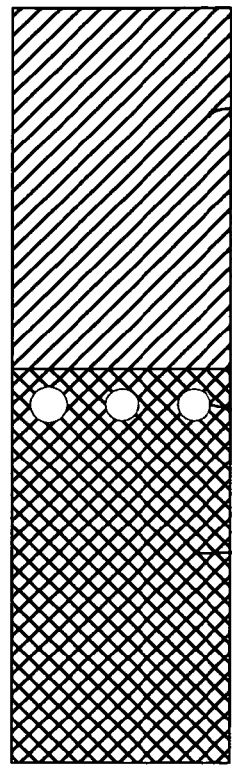
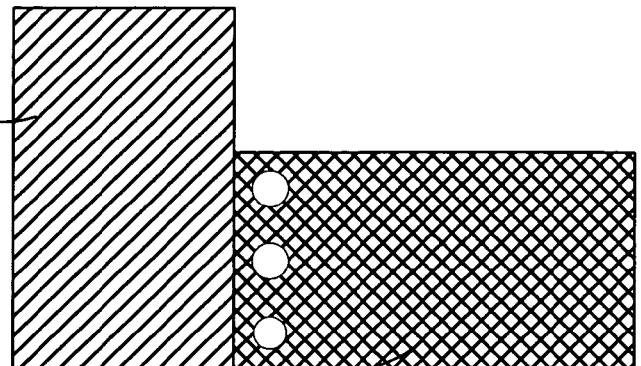
Fig. 2a
Fig. 2b
PRIOR ART
Fig. 3
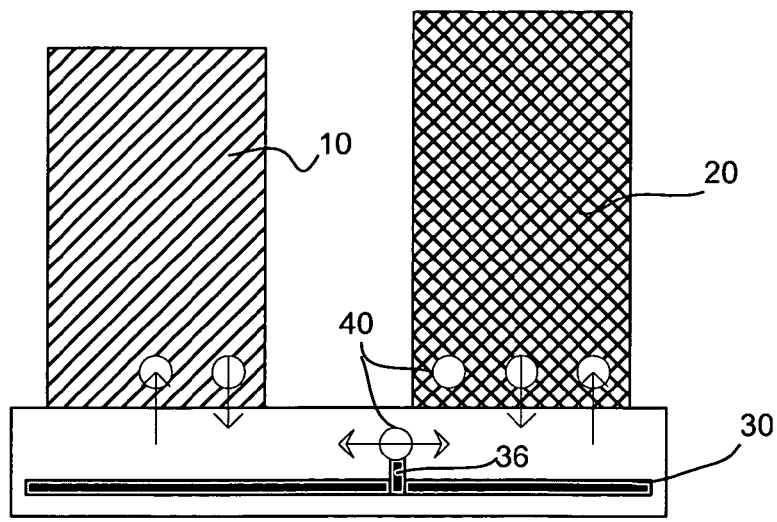

TRANSPORT SYSTEM FOR A LITHOGRAPHIC APPARATUS AND DEVICE MANUFACTURING METHOD

FIELD

The present invention relates to a transport system for a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

In a factory, commonly referred to as a "fab" or "foundry", in which semiconductor devices are manufactured, each lithographic apparatus is commonly grouped with a "track" comprising wafer handling devices and pre- and post-processing devices to form a "lithocell". The processing devices of the track may include chiller plates for cooling substrates, bake plates for heating substrates, spin coaters for coating substrates, e.g. with resist, developers and a substrate handler, or robot, for moving substrates between the various devices within the track and substrate load and unload ports of the lithographic apparatus. The devices in the track are used to prepare the substrate for the lithographic exposure process (for example, coating the substrate) and to finish the lithographic process (for example, developing the substrate) and so the substrates must be transferable between the track and the lithographic apparatus. These devices are generally referred to collectively as the track.

Substrates, such as wafers, which may be blank or have already been processed to include one or more process or device layers, are delivered to the lithocell in lots (also referred to as batches) for processing. The lot size may be arbitrary or determined by the size of carrier used to transport substrates around the fab between different process apparatuses, metrology apparatuses (which can include inspection apparatuses) or storage locations.

Substrates are typically moved within the track and between the lithographic apparatus and the track by one or more robot arms in the track, one robot arm being capable of reaching beyond the confines of the track to, for example, the load and unload ports of the lithographic apparatus. There are also configurations in which the transfer robot is located in the lithographic apparatus instead of the track. The configuration of the track and lithographic apparatus can therefore be either an in-line configuration, where one end of the track is aligned with one end of the lithographic apparatus; or an orthogonal configuration, where the track is placed perpendicularly to the lithographic apparatus, depending on the reach of the robot arm and the position of the load port of the lithographic apparatus. Because the configurations of the lithocell are limited, lithographic apparatus sizes are limited, as is the packing density of such lithocells in a fab. Furthermore, older fabs are designed for older lithocells that print on small substrates (typically 200 mm in diameter). Because of the limited configurations, it is difficult to replace older lithocells with newer lithocells that accommodate bigger substrates (for example, 300 mm).

SUMMARY

Accordingly, it would be advantageous, for example, to provide a lithographic processing cell and device manufacturing method that enables more practical and efficient configurations of tracks and lithographic apparatuses.

According to an aspect of the invention, there is provided a lithocell comprising:
  a lithographic apparatus, comprising:
    an illuminator configured to provide a beam of radiation,
    a support structure configured to hold a patterning device, the patterning device configured to impart the beam with a pattern in its cross-section,
    a substrate table configured to hold a substrate, and
    a projection system configured to project the patterned beam onto a target portion of the substrate;
  a track comprising one or more processing devices; and
  a transport system configured to transport the substrate along an elongate transporter pathway between the track and the lithographic apparatus.

The transport system allows the track and the lithographic apparatus to be placed in any orientation while enabling the automatic transportation of substrates between the track and the lithographic apparatus. It is therefore possible to have a more efficient packing of these elements and a greater density to be packed into a smaller space. It is also simpler to replace individual elements with the same or different elements. The elements can be not only the track and lithographic apparatus, but also other process apparatus, metrology apparatus and storage or buffer apparatus through which the substrate passes.

In an embodiment, the transport system has its own mini-environment. One or more mini-environments are much easier and cheaper to maintain and keep clean than an entire clean room, which could be the size of several mini-environments. A mini environment may also be kept in different conditions depending on the requirements of the system(s) it contains.

The track and the lithographic apparatus may be placed side by side and the transport system may comprise a linear transporter pathway between them. This enables a linear system to be set up which has lithographic apparatuses and tracks on one side and the linear transporter pathway on the other, creating easier access to either side for maintenance, etc. This linear embodiment is a simple building block from which larger embodiments may be devised.

The transport system may comprise at least two transporter pathways, one configured to transport the substrate from the track to the lithographic apparatus and one configured to transport the substrate from the lithographic apparatus to the track. This may help to create a faster, more efficient system. If the pathways are closed shapes such as circles, for instance, one transporter pathway can transport a substrate clockwise and the other, counterclockwise. It is therefore possible to create a transport system without the need to change direction of transport, potentially rendering the system lighter and more efficient.

The transport system may comprise at least one transport robot configured to transport the substrate along the transporter pathway. The robot may be adapted to do any combination of loading and unloading of substrates, as well as traveling along the transporter pathways in order to transfer substrates from the track to the lithographic apparatus and vice versa.

The transport system may serve a plurality of lithographic apparatuses. This allows substrates from tracks to be supplied to any one of a number of lithographic apparatuses, depending on what is required at that time. For example, the lithographic apparatuses may be of different qualities depending on the criticality of the layer being exposed. Furthermore, there may be a plurality of tracks supplying a plurality of lithographic apparatuses, enabling efficient and quick application of patterns to several substrates in a single system. In an embodiment, the transport system may, in addition to a lithographic apparatus and a track, serve at least one of a substrate process apparatus and a substrate metrology apparatus to form an extended substrate assembly line.

In an embodiment, the transport system is formable to a desired shape, for example, to a square, etc., to accommodate the plurality of lithographic apparatuses. This also allows more efficient packing and therefore increased density of lithographic apparatuses and tracks in a smaller space, since the transport system may adapt to the space available.

In an embodiment, the transport system comprises one or more transporter pathways configured to transport a substrate between different processing devices of the track. The transport system may be used for more than simply transporting a substrate from a track to a lithographic apparatus and back again. It may transport a substrate within the track and from one processing device to another, creating a seamless movement of the substrate from the beginning of the lithographic process to the end and to other processes such as etching, implant and sputtering, which are all coupled to the lithographic process.

There are several ways in which a substrate may be transported on a transporter pathway. The transport system may comprise a conveyor in the form of a shuttle on a linear guide actuated by one of an electric motor and pneumatic motor or a conveyor belt with a pin and/or wire loop configured to support a substrate transported thereon. The linear guide may be one of a roller bearing guide and a gas bearing guide In an embodiment, the lithocell comprises a gangway set apart from the transport system configured to allow passage a distance away from the transport system. This is to provide a safe place for personnel to walk through for maintenance, etc. of the system.

According to another aspect of the invention, there is provided a lithocell comprising:
  a lithographic apparatus, comprising:
    an illuminator configured to provide a beam of radiation,
    a support structure configured to hold a patterning device, the patterning device configured to impart the beam with a pattern in its cross-section,
    a substrate table configured to hold a substrate, and
    a projection system configured to project the patterned beam onto a target portion of the substrate;
  a track comprising one or more processing devices; and
  a transport system, external to the track and lithographic apparatus, configured to transport the substrate between the track and the lithographic apparatus, the transport system comprising a robot arm pivotable about an axis at its first end and adapted to hold a substrate at its opposite end.

According to another aspect of the invention, there is provided a device manufacturing method using a lithocell comprising a lithographic apparatus and a track comprising:
  applying a radiation-sensitive material to a substrate in the track;
  transporting the substrate to the lithographic apparatus from the track using a transporter between them; and
  projecting a patterned beam of radiation onto a target portion of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be, considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between an element of the projection system and the substrate. Immersion liquids may also be applied to other spaces in the lithographic apparatus, for example, between the mask and an element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts configurations of a track and a lithographic apparatus of the prior art;

FIG. 3 depicts a configuration of a lithographic apparatus and a track with a transport system according to a first embodiment of the invention;

DETAILED DESCRIPTION

Figure 1:
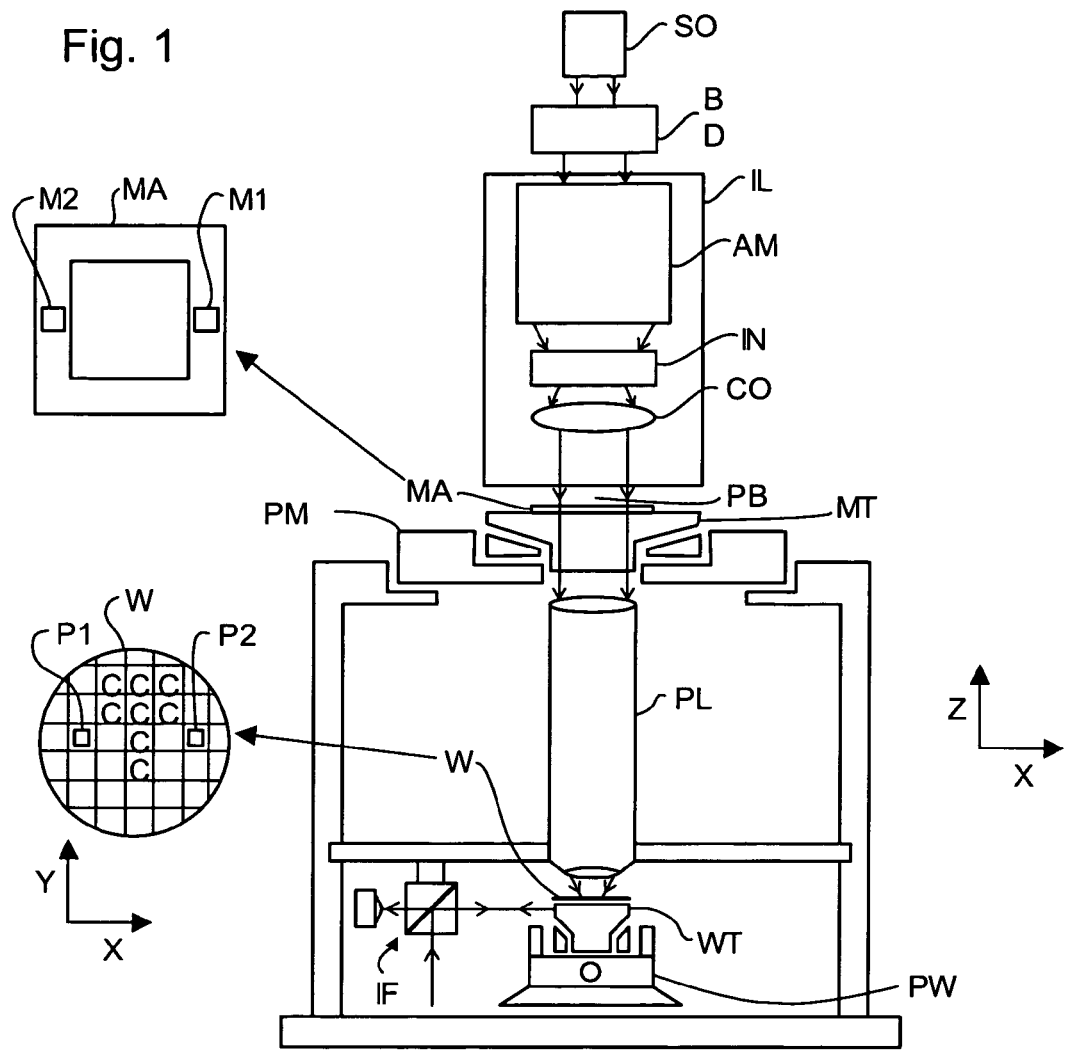
FIG. 1 depicts a lithographic apparatus according to an embodiment of the invention.

FIG. 1 schematically depicts a lithographic apparatus according to a particular embodiment of the invention. The apparatus comprises:
- an illumination system (illuminator) IL for providing a projection beam PB of radiation (e.g. UV radiation).
- a first support structure (e.g. a mask table) MT for supporting a patterning device (e.g. a mask) MA and connected to a first positioning device PM for accurately positioning the patterning device with respect to item PL;
- a substrate table (e.g. a wafer table) WT for holding a substrate (e.g. a resist-coated wafer) W and connected to a second positioning device PW for accurately positioning the substrate with respect to item PL; and
- a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or it may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Turning to FIG. 2, known configurations of a track 20 and a lithographic apparatus 10 are depicted. The track and lithographic apparatus are either in an in-line configuration as shown in FIG. 2a, or an orthogonal configuration as shown in FIG. 2b. Mirrored configurations of the track and lithographic apparatus are also possible. The substrates 40 which are in the track, in the lithographic apparatus or in the transporter are represented in the figures by an arbitrary number of circles.

FIG. 3 shows an embodiment of the present invention, which includes a track 20 and a lithographic apparatus 10 in a side-by-side layout with a transporter 30, comprising one or more elongate transporter pathways, between them at one end. The transporter 30 enables the substrates 40 to be transported between the track 20 and the lithographic apparatus 10. The arrows show the loading and unloading directions of the substrates 40 between the lithographic apparatus 10/track 20 and the transporter 30. A transporting device 36 that travels along the transporter pathway(s) 30 and carries the substrates 40 can take several shapes. It can be a shuttle on a linear motor or conveyor belt, the shuttle having a device or structure to support the substrates. The device or structure to support the substrates 40 can be, for example, in the form of pins or wire loops on which the substrates rest. The transporter 30 can comprise one conveyor that can reverse its direction of travel, or there can be two or more conveyors that travel in opposite directions. In the latter case, there may be one or several shuttles 36 traveling on one or several transporter pathways. As well as being layered horizontally, the load and unload ports of the track and lithographic apparatus can be stacked vertically. Furthermore, the load and unload ports may be in a single "station", e.g., one device or structure can function as both a load port and a unload port.

In an embodiment, the transport system can transport the substrate 40 not only to and from the lithographic apparatus 10, but also within the track 20, between the different processing devices (which may include metrology devices and/or storage or buffer devices). Furthermore, the transport system can transport the substrate to one or more further metrology and process apparatuses external to the lithocell (not shown), e.g. to a scatterometer, an implanter, etc.

The transport system transports substrates 40 between process clusters in a mini environment. These clusters can be a combination of metrology and process apparatuses, such as the lithographic apparatus and the track or any other process and/or metrology apparatuses that use the same environment. The mini environment is formed by the introduction of a case around the transport system. The case can typically comprise one or more HEPA filters and one or more fans to force gas (e.g., air) through the one or more filters to form steady laminar flow of clean gas around the transport system.

Figure 4:
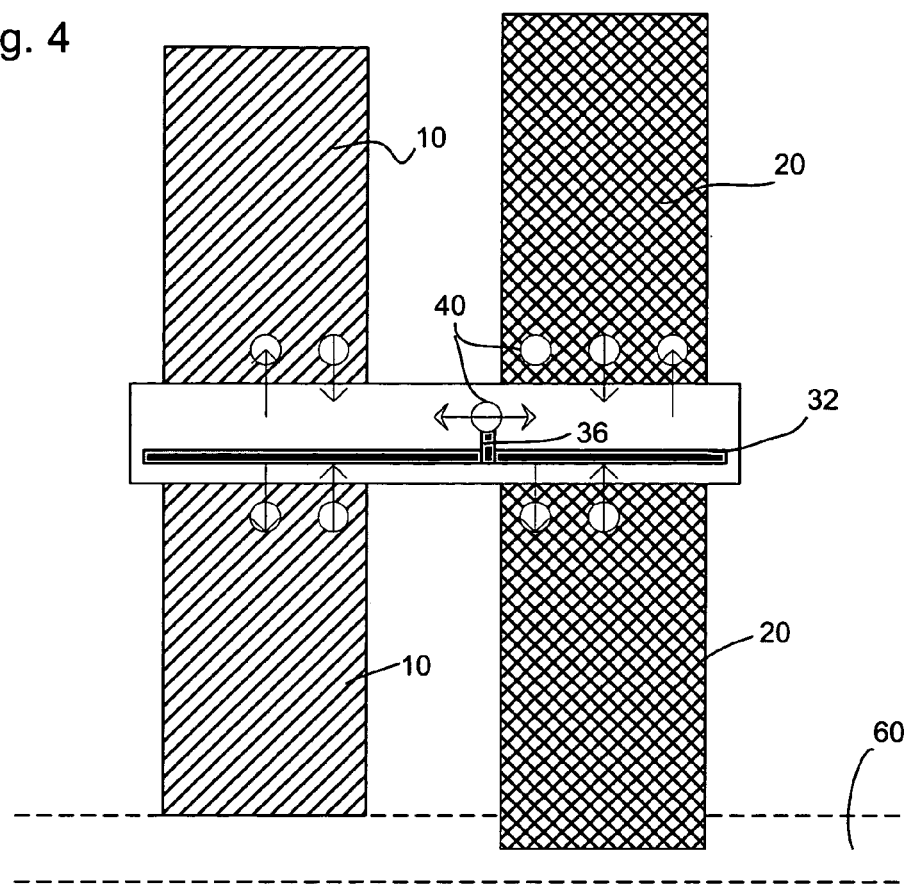
FIG. 4 depicts a configuration of lithographic apparatuses, tracks and a transport system according to a second embodiment of the invention.

FIG. 4 shows another embodiment of the present invention, including two lithographic apparatuses 10 and two tracks 20 connected by transporter 32 between them. There can, of course, be more of each of the lithographic apparatuses and tracks and there does not have to be the same number of tracks as lithographic apparatuses or as other process/metrology apparatuses. Furthermore, with the addition of further transporter pathways to the transporter 32 or transport devices 36 on the transporter pathway(s) of the transporter 32, the lithographic apparatuses 10 and tracks 20, as well as any other process/metrology apparatuses, can be positioned on either side of the transporter pathway(s) of the transporter 32 and the transport system can take on more complex configurations to feed a greater number of apparatus.

As in FIG. 3, the transporter 32 transports substrates 40 between the various tracks 20 and lithographic apparatuses 10. There is also shown in FIG. 4 an automated material handling system (AMHS) 60 via which substrates may be removed, added or replaced, etc. via the use of cassettes or carriers, without interfering with the transport system. Clearly, there may be an AMHS 60 anywhere where access to the tracks 20 and lithographic apparatuses 10 is required.

Figure 5:
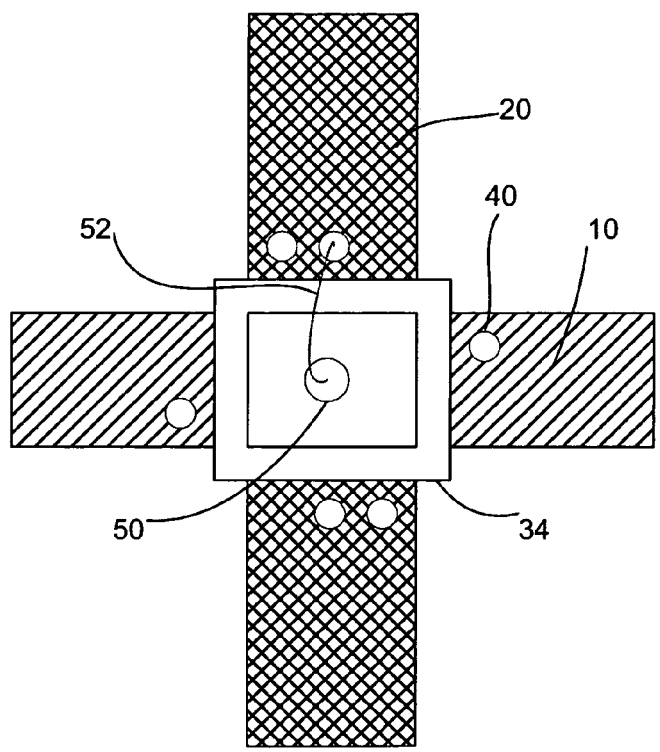
FIG. 5 depicts a configuration of lithographic apparatuses, tracks and a transport system comprising a robot arm according to a third embodiment of the invention.

FIG. 5 shows a further embodiment of the present invention, where the tracks 20 and lithographic apparatuses 10 are not in a side-by-side configuration, but are spaced out around a square transporter 34. There are several ways the substrate transport system can work. The first is in the same way as shown in FIGS. 3 and 4, but with a non-linear elongate transporter pathway, e.g., a circular, rectangular or square elongate pathway. Alternatively, a central robot 50 and arm 52 can transport the substrates between the tracks 20 and the lithographic apparatuses 10. This method is particularly adapted to a shape such as that shown in FIG. 5, where the robot arm 52 can rotate about a central axis. Alternatively, the robot 50 can itself travel along an elongate transporter pathway (e.g., a circular, rectangular or square pathway) to transport the substrates 40 in the way shown in FIGS. 3 and 4, the robot 50 effectively taking the role of the shuttle described above. In this case, the arm 52 is optional.

While specific embodiments of the invention have been described above, it will be appreciated that the invention may be practiced otherwise than as described. The description is not intended to limit the invention.

The invention claimed is:
1. A lithocell comprising:
a lithographic apparatus, comprising:
an illuminator configured to condition a beam of radiation,
a support structure configured to hold a patterning device, the patterning device configured to impart the beam with a pattern in its cross-section,
a substrate table configured to hold a substrate, and
a projection system configured to project the patterned beam onto a target portion of the substrate;
a track comprising one or more processing devices; and
a transport system, outside of the lithographic apparatus and the track, configured to transport the substrate along an elongate transporter pathway between the track and the lithographic apparatus, wherein the track and the lithographic apparatus are side by side along at least part of their respective long sides and the transport system extends along at least part of a short side of the lithographic apparatus and the track.

2. A lithocell according to claim 1, wherein the transport system comprises its own mini-environment.

3. A lithocell according to claim 1, wherein the transport system comprises a linear transporter pathway between the track and the lithographic apparatus.

4. A lithocell according to claim 1, wherein the transport system comprises at least two transporter pathways, one configured to transport the substrate from the track to the lithographic apparatus and one configured to transport the substrate from the lithographic apparatus to the track.

5. A lithocell according to claim 1, wherein the transport system comprises at least one transport robot configured to transport the substrate along the transporter pathway.

6. A lithocell according to claim 1, wherein the transport system is configured to serve a plurality of lithographic apparatuses.

7. A lithocell according to claim 1, comprising a plurality of tracks.

8. A lithocell according to claim 1, wherein the transport system is configured to serve a substrate process apparatus, a substrate metrology apparatus, or both, to form an extended substrate assembly line.

9. A lithocell according to claim 1, wherein the transport system is formable to a desired shape.

10. A lithocell according to claim 1, wherein the transport system comprises one or more transporter pathways configured to transport a substrate between different processing devices of the track.

11. A lithocell according to claim 1, wherein the transport system comprises a conveyor in the form of a shuttle on a linear guide actuated by an electric motor, or a pneumatic motor.

12. A lithocell according to claim 11, wherein the linear guide is a roller bearing guide or a gas bearing guide.

13. A lithocell according to claim 1, wherein the transport system comprises a conveyor belt configured to support the substrate transported thereon.

14. A lithocell according to claim 1, further comprising an automated material handling system configured to transport substrates to or from the lithographic apparatus or track independently from the transport system.

15. A lithocell comprising:
a lithographic apparatus, comprising:
an illuminator configured to condition a beam of radiation,
a support structure configured to hold a patterning device, the patterning device configured to impart the beam with a pattern in its cross-section,
a substrate table configured to hold a substrate, and
a projection system configured to project the patterned beam onto a target portion of the substrate;
a track comprising one or more processing devices; and
a transport system, external to the track and lithographic apparatus, configured to transport the substrate between the track and the lithographic apparatus, the transport system comprising a robot arm pivotable about an axis at its first end and adapted to hold a substrate at its opposite end, wherein the track and the lithographic apparatus are side by side along at least part of their respective long sides and the transport system extends along at least part of a short side of the lithographic apparatus and the track.

16. A lithocell according to claim 15, wherein the transport system comprises its own mini-environment.

17. A lithocell according to claim 15, wherein the transport system is configured to serve a plurality of lithographic apparatuses.

18. A lithocell according to claim 15, comprising a plurality of tracks.

19. A lithocell according to claim 15, wherein at least two lithographic apparatus and at least two tracks are disposed around the robot arm.

20. A lithocell according to claim 15, wherein the transport system is configured to serve a substrate process apparatus, a substrate metrology apparatus, or both, to form an extended substrate assembly line.

21. A device manufacturing method using a lithocell comprising a lithographic apparatus and a track comprising:
applying a radiation-sensitive material to a substrate in the track;
transporting the substrate to the lithographic apparatus from the track using a transporter between and external to them, wherein the track and the lithographic apparatus are side by side along at least part of their respective long sides and the transporter extends along at least part of a short side of the lithographic apparatus and the track; and
projecting a patterned beam of radiation onto a target portion of the substrate.

22. A device manufacturing method according to claim 21, wherein the transporter is configured to transport the substrate along an elongate transporter pathway between the track and the lithographic apparatus.

23. A device manufacturing method according to claim 21, wherein the transporter, external to the track and lithographic apparatus, is configured to transport the substrate between the track and the lithographic apparatus by a robot arm pivotable about an axis at its first end and adapted to hold a substrate at its opposite end.

* * * * *